(12) United States Patent
Shiga et al.

(10) Patent No.: US 7,692,948 B2
(45) Date of Patent: Apr. 6, 2010

(54) SEMICONDUCTOR MEMORY DEVICE

(75) Inventors: Hidehiro Shiga, Kamakura (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 72 days.

(21) Appl. No.: 12/132,713

(22) Filed: Jun. 4, 2008

(65) Prior Publication Data

US 2008/0304309 A1 Dec. 11, 2008

(30) Foreign Application Priority Data

Jun. 6, 2007 (JP) ............................. 2007-150077

(51) Int. Cl.
*G11C 11/22* (2006.01)
(52) U.S. Cl. ...................... 365/145; 365/207
(58) Field of Classification Search ................. 365/145, 365/207, 205
See application file for complete search history.

(56) References Cited

U.S. PATENT DOCUMENTS 6,498,743 B2 * 12/2002 Maruyama .................. 365/145
6,885,598 B2 * 4/2005 Kamoshida et al. ......... 365/201
6,898,104 B2 * 5/2005 Ogiwara et al. ............. 365/145

FOREIGN PATENT DOCUMENTS

JP 2002-133857 5/2002

OTHER PUBLICATIONS

Yeonbae Chung et al.,"A 3.3-V, 4-Mb Nonvolatile Ferroelectric RAM with Selectively Driven Double-Pulsed Plate Read/Write-Back Scheme", IEEE Journal Of Solid-State Circuits, vol. 35, No. 5, May 2000, pp. 697-704.

* cited by examiner

*Primary Examiner*—Anh Phung
(74) *Attorney, Agent, or Firm*—Oblon, Spivak, McClelland, Maier & Neustadt, L.L.P.

(57) ABSTRACT

The sense amp circuit includes a first node given a first, positive constant voltage larger than a fixed potential before reading, a second node given a second, negative constant voltage smaller than the fixed potential before reading, and a third node to be connected to the first and second nodes on reading. A first transistor is connected between the first node and the bit line and operative to turn on when the potential on the bit line becomes smaller than the fixed potential. A second transistor is connected between the second node and the bit line and operative to turn on when the potential on the bit line becomes larger than the fixed potential. A first capacitor is connected between the first node and the fixed potential. A second capacitor is connected between the second node and the fixed potential.

14 Claims, 10 Drawing Sheets

SEMICONDUCTOR MEMORY DEVICE

CROSS-REFERENCE TO RELATED APPLICATION

This application is based upon and claims the benefit of priority from prior Japanese Patent Application No. 2007-150077, filed on Jun. 6, 2007, the entire contents of which are incorporated herein by reference.

BACKGROUND OF THE INVENTION

1. Field of the Invention

The present invention relates to a semiconductor memory device, and more particularly to a ferroelectric memory, which comprises memory cells each including a ferroelectric capacitor and a transistor.

2. Description of the Related Art

A ferroelectric memory (FeRAM) is such a semiconductor memory device that utilizes the hysteresis characteristic of a ferroelectric capacitor to store data nonvolatilely in accordance with two different polarization magnitudes of the ferroelectric material.

A memory cell in a ferroelectric memory of the conventional art is generally configured to use the same architecture as a DRAM. That is, a paraelectric capacitor is replaced with a ferroelectric capacitor and the ferroelectric capacitor is serially connected to a selection transistor. Such memory cells are arranged plural in grid to configure a memory cell array. In data reading and so forth, the word line (selection line) related to a memory cell aimed at reading and so forth is raised to turn on the selection transistor, which connects the memory cell to a bit line. Then, while a plate line voltage is applied to a plate line, a variation in voltage caused on the bit line in accordance with the residual polarization of the ferroelectric capacitor is sensed/amplified at a sense amp for data reading.

In the above structure, however, an increase in bit line capacitance prevents application of a sufficient voltage across terminals of the ferroelectric capacitor and results in insufficient reading of residual polarization information, which disadvantageously leads to a smaller amount of read signals (problem 1). In addition, variations in temperature, variations over time, and so forth may change the hysteresis characteristic of the ferroelectric capacitor. In such the case, either in a memory cell holding "0" data or in a memory cell holding "1" data, a variation in read voltage occurs and disadvantageously makes it difficult to set the reference voltage in the sense amp (problem 2).

In contrast, JP 2002-133857A proposes a ferroelectric memory, which uses a scheme that keeps the bit line voltage at 0 on reading. In this scheme, all pieces of residual polarization information about the ferroelectric capacitor can be read out. Accordingly, the above problem 1 can be solved but the above problem 2 can not be solved yet.

On the other hand, there is another scheme as proposed by Yeonbae Chung et al., "A 3.3-V, 4 Mb nonvolatile ferroelectric RAM with selectively driven double pulsed plate read/write-back scheme", IEEE journal of solid-state circuits, Vol. 35, No. 5, PP/697-704, 2000. This scheme raises a plate line voltage once to read out the charge and then lowers the plate line voltage again to the ground potential for sensing in this state. In this scheme, the bit line associated with the memory cell holding "0" data is surely kept at 0 V. Accordingly, the problem 2 can be solved but the problem 1 still remains.

SUMMARY OF THE INVENTION

In one aspect the present invention provides a semiconductor memory device, comprising: a memory cell array with memory cells each including a ferroelectric capacitor and a selection transistor serially connected; a plate line connected to one end of the ferroelectric capacitor and supplied with a certain plate line voltage; a bit line connected to one end of the selection transistor; and a sense amp circuit operative to sense/amplify the voltage on the bit line, the sense amp circuit including a first node given a first constant voltage with a positive value larger than a fixed potential before reading, a second node given a second constant voltage having a negative value smaller than the fixed potential before reading, a third node to be connected to the first and second nodes on reading, a first transistor connected between the first node and the bit line and operative to turn on when the potential on the bit line becomes smaller than the fixed potential, a second transistor connected between the second node and the bit line and operative to turn on when the potential on the bit line becomes larger than the fixed potential, a first capacitor connected between the first node and the fixed potential, a second capacitor connected between the second node and the fixed potential, and a differential amplifier circuit operative to amplify the potential on the third node in comparison with a reference potential.

DETAILED DESCRIPTION OF THE EMBODIMENTS

The embodiments of the present invention will now be described in detail with reference to the drawings.

First Embodiment

Figure 1:
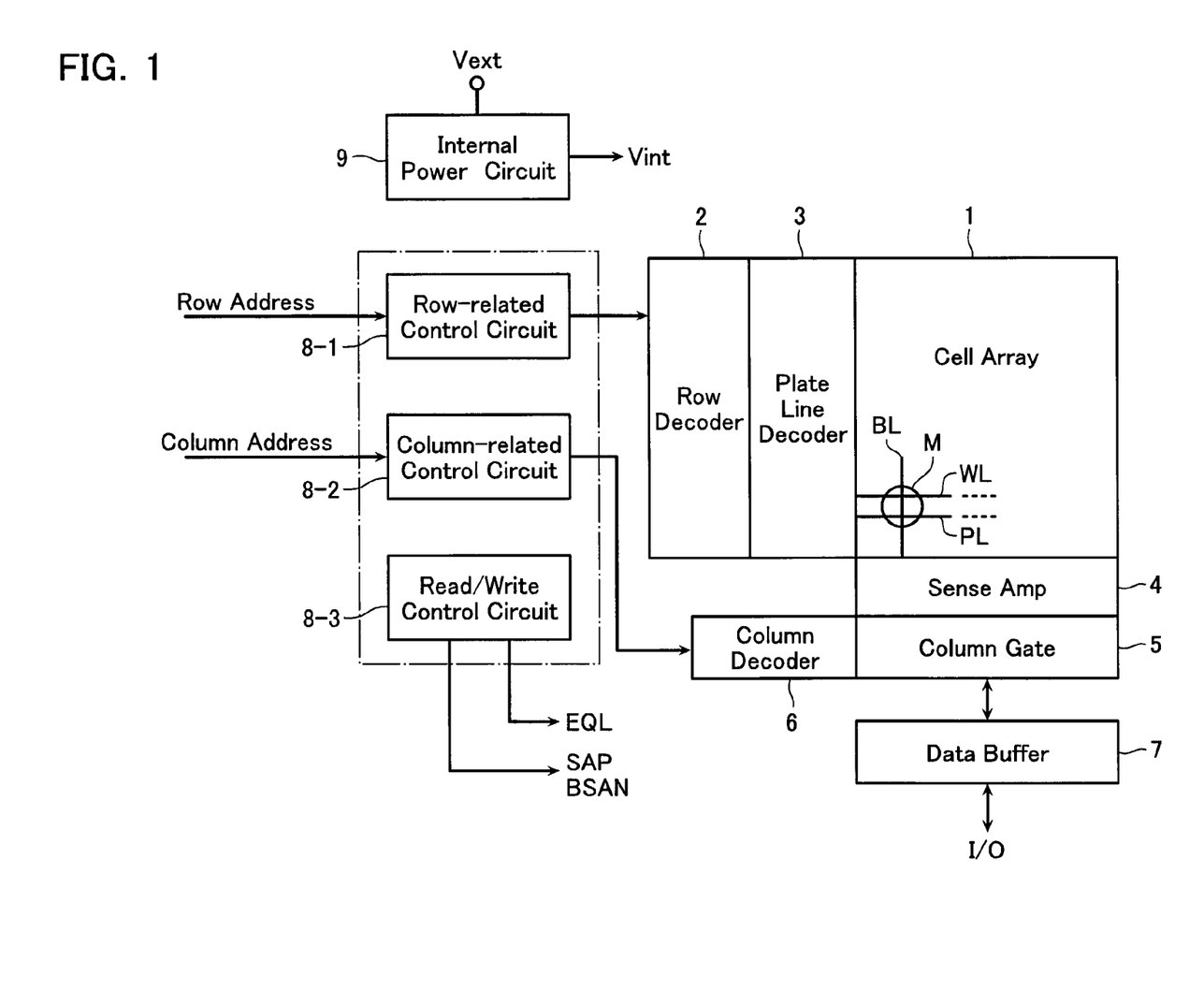
FIG. 1 shows a block configuration of a ferroelectric memory according to a first embodiment.

FIG. 1 shows a block configuration of a ferroelectric memory according to a first embodiment.

A memory cell array 1 comprises arrayed memory cells M each including a ferroelectric capacitor C and a selection transistor T. A memory cell M is located at each intersection of a word line WL with a plate line PL and a bit line BL. The memory cell array 1 is provided with a row decoder 2 to selectively drive a word line WL and with a plate line decoder 3 to selectively drive a plate line PL.

Figure 2:
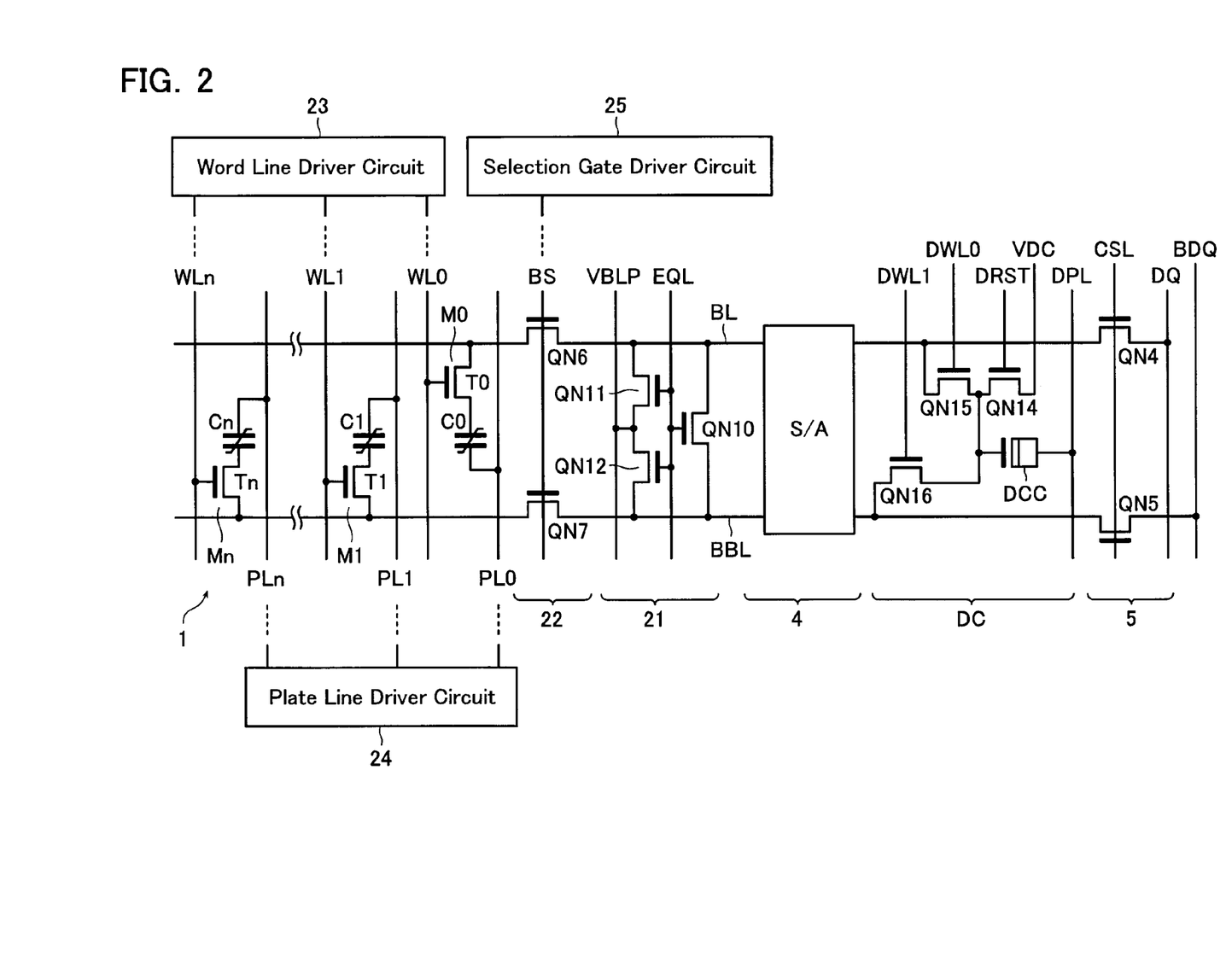
FIG. 2 shows a structure of a memory cell array 1 of FIG. 1 for a pair of complementary bit lines BL, BBL.

The memory cell array 1 includes a pair of complementary bit lines BL, BBL as shown in FIG. 2. Herein shown is an example of the 1-transistor/1-capacitor configuration in which a memory cell Mi (i=0-n) includes one selection transistor Ti and one ferroelectric capacitor Ci. The selection transistor Ti has one end connected to the bit line BL or BBL, and a gate connected to a word line WLi. The ferroelectric capacitor Ci has a terminal (plate electrode) connected to a plate line PLi.

A word line driver circuit 23 operative to drive the word line WLi is contained in the row decoder 2. A plate line driver circuit 24 operative to drive the plate line PLi is contained in the plate line decoder 3. The bit lines BL, BBL are divided by NMOS transistors QN6, QN7 in a selection gate 22 between the cell array and the sense amp circuit 4. The selection gate 22 is on/off controlled by a selection signal from a selection gate driver circuit 25.

The bit lines BL, BBL outside the selection gate 22 are provided with a bit line equalizer circuit 21 and the sense amp circuit 4. The details of the configuration of the sense amp circuit 4 will be described later.

The equalizer circuit 21 includes an equalizing NMOS transistor QN10 operative to make a short circuit between the bit lines BL, BBL. The equalizer circuit 21 includes precharging NMOS transistors QN11, QN12 connected at one end to the bit lines BL, BBL. These transistors have respective gates, which are commonly controlled by an equalizing signal EQL.

A dummy cell DC is provided to generate a reference potential for use in comparison with a read voltage out of a memory cell. The dummy cell DC includes a reset transistor QN14, selection transistors QN15, QN16, and a dummy capacitor DCC.

The selection transistor QN15 is connected between the bit line BL and one end of the dummy capacitor DCC while the selection transistor QN16 is connected between the bit line BBL and the one end of the dummy capacitor DCC.

The other end of the dummy capacitor DCC is given a plate line potential DPL. The selection transistors QN15, QN16 have respective gates, which are connected to dummy word lines DWL0, DWL1. The reset transistor QN14 has one end connected to the one end of the dummy capacitor DCC and has the other end given a reference voltage VDC. Thus, the one end of the dummy capacitor DCC is reset to the reference voltage VDC in accordance with a reset signal DRST.

The bit lines BL, BBL are connected to data lines DQ, BDQ via NMOS transistors QN4, QN5 contained in a column gate 5. The column gate 5 is controlled by a column decoder 6. Read data is provided to an I/O terminal via a data buffer 7. Write data fed from the I/O terminal is transferred via the data buffer 7 to the sense amp circuit 4 associated with a column selected by the column gate 5 and written in a selected memory cell in the memory cell array 1.

A control circuit 8 operative to execute read/write control of the memory cell array 1 includes a row-related control circuit 8-1, a column-related control circuit 8-2, and a read/write control circuit 8-3.

The row-related control circuit 8-1 receives a row address and controls the row decoder 2 and the plate line decoder 3. The column-related control circuit 8-2 receives a column address and controls the column decoder 6. The read/write control circuit 8-3 generates a bit line equalizing signal EQL, sense amp activating signals SAP, BSAN and so forth.

An internal power circuit 9 is also provided to receive an external supply voltage Vext and generate an internal supply voltage Vint. The internal power circuit 9 may include a booster circuit operative to generate a boosted voltage, if required.

Subsequently, the configuration of the sense amp circuit 4 is described in detail with reference to FIG. 3.

Figure 3:
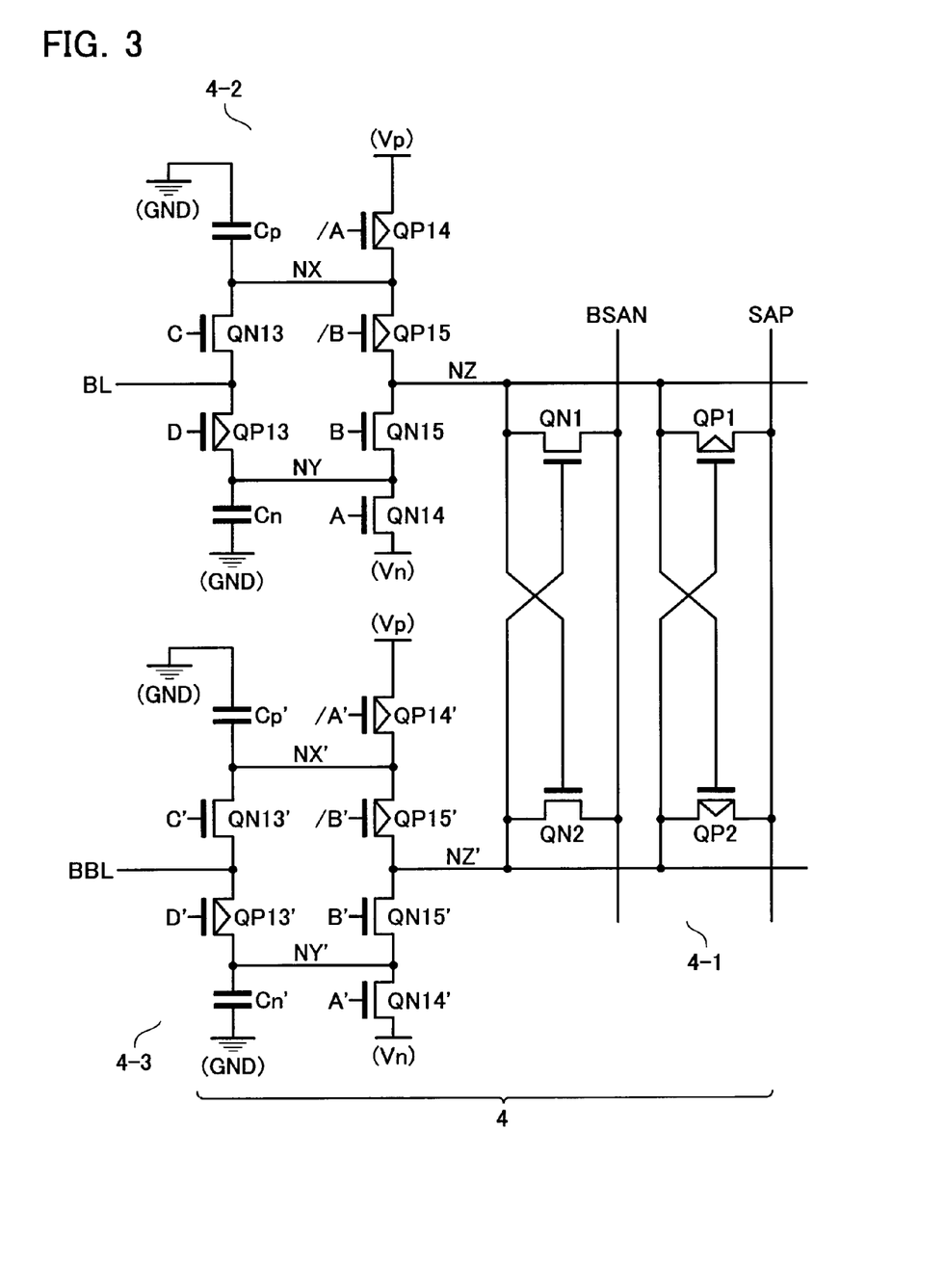
FIG. 3 is a circuit diagram showing the details of a configuration of a sense amp circuit 4.

The sense amp circuit 4 includes a differential amplifier 4-1, which comprises an NMOS flip-flop composed of NMOS transistors QN1 and QN2, and a PMOS flip-flop composed of PMOS transistors QP1 and QP2 as shown in FIG. 3. The NMOS flip-flop and the PMOS flip-flop are controlled for operation by the sense amp activating signals BSAN, SAP, respectively.

The PMOS transistors QP1, QP2 contained in the PMOS flip-flop are serially connected between the nodes NZ and NZ' and have respective gates connected to the nodes NZ and NZ' to configure a flip-flop circuit. The NMOS transistors QN1, QN2 contained in the NMOS flip-flop are serially connected between the nodes NZ and NZ' and have respective gates connected to the nodes NZ and NZ'.

The sense amp circuit 4 further includes a bit line control circuit 4-2 between the bit line BL and the differential amplifier 4-1, and a bit line control circuit 4-3 between the bit line BBL and the differential amplifier 4-1 as shown in FIG. 3.

The bit line control circuit 4-2 controls the potential on the bit line BL such that it is fixed to the ground potential GND on reading data out of a memory cell M connected to the bit line BL. The bit line control circuit 4-2 has nodes NX, NY. Control of the potential on the bit line BL changes the potentials on the nodes NX, NY. The potential on the node NY varies depending on data in the memory cell M. Therefore, when the nodes NX, NY are connected to a node NZ, sensing the potential on the node NZ makes it possible to determine whether the data held in the memory cell M is "1" or "0".

The bit line control circuit 4-2 and the bit line control circuit 4-3 have the same configuration. As shown in FIG. 3, the bit line control circuit 4-2 includes n-type MOS transistors QN13-QN15, p-type MOS transistors QP13-QP15, and capacitors Cp and Cn. The components in the bit line control circuit 4-3, or n-type MOS transistors QN13'-QN15', p-type MOS transistors QP13'-QP15', and capacitors Cp' and Cn' correspond to the n-type MOS transistors QN13-QN15, the p-type MOS transistors QP13-QP15, and the capacitors Cp and Cn, respectively. Accordingly, only the bit line control circuit 4-2 is described hereinafter.

The n-type MOS transistor QN13 and the p-type MOS transistor QP13 are commonly connected at one end to the bit line and respectively connected at the other end to the node NX and the node NY.

The node NY is also connected to the other end of the n-type MOS transistor QN14. One end of the transistor QN14 is given a negative constant voltage Vn (<0) smaller than the ground potential GND. The node NY is given the negative constant voltage Vn during reading while the transistor QN14 receives a gate signal A="H" and turns on (this point is described later in the description of operation).

On the other hand, the node NX is also connected to the other end of the p-type MOS transistor QP14. One end of the transistor QP14 is given a positive constant voltage Vp (>0) larger than the ground potential GND.

The node NX is given the positive constant voltage Vp during reading while the transistor QP14 receives a gate signal /A="L" or the inverted signal of the gate signal A and turns on (this point is described later in the description of operation). The Vp and Vn preferably have the equal absolute value but are not surely limited to this.

The transistor QN13 is given a signal C on the gate during reading as described later. The signal C has an almost equal magnitude to the threshold voltage Vth (>0) of the transistor QN13. Therefore, the transistor QN13 turns on when the potential on the bit line BL becomes even slightly smaller than 0.

On the other hand, the transistor QP13 is given a signal D on the gate. The signal D has an almost equal magnitude to the threshold voltage Vtp (>0) of the transistor QP13. Therefore, the transistor QP13 turns on when the potential on the bit line BL becomes even slightly larger than 0.

The capacitor Cp is connected between the node NX and the ground potential GND and plays a role in holding the charge in accordance with the voltage applied to the node NX. The capacitor Cn is connected between the node NY and the ground potential GND and plays a role in holding the charge in accordance with the voltage applied to the node NY. The capacitors Cp and Cn preferably have the same capacitance but are not surely limited to this.

The p-type MOS transistor QP15 and the n-type MOS transistor QN15 are serially connected between the node NX and the node NY. The connection node between the transistors QP15, QN15 is the node NZ. The transistors QP15, QN15 are turned on at the same time in accordance with a gate signal B and the inverted signal /B. When the transistors QP15, QN15 turn on, the nodes NX and NY are connected to the node NZ. The transistors QP15 and QN15 are a p-type and an n-type MOS transistor, respectively, but are not surely limited to this. Rather, they may be those that can switch connection and disconnection between the node NX, NY and the node NZ.

Figure 4:
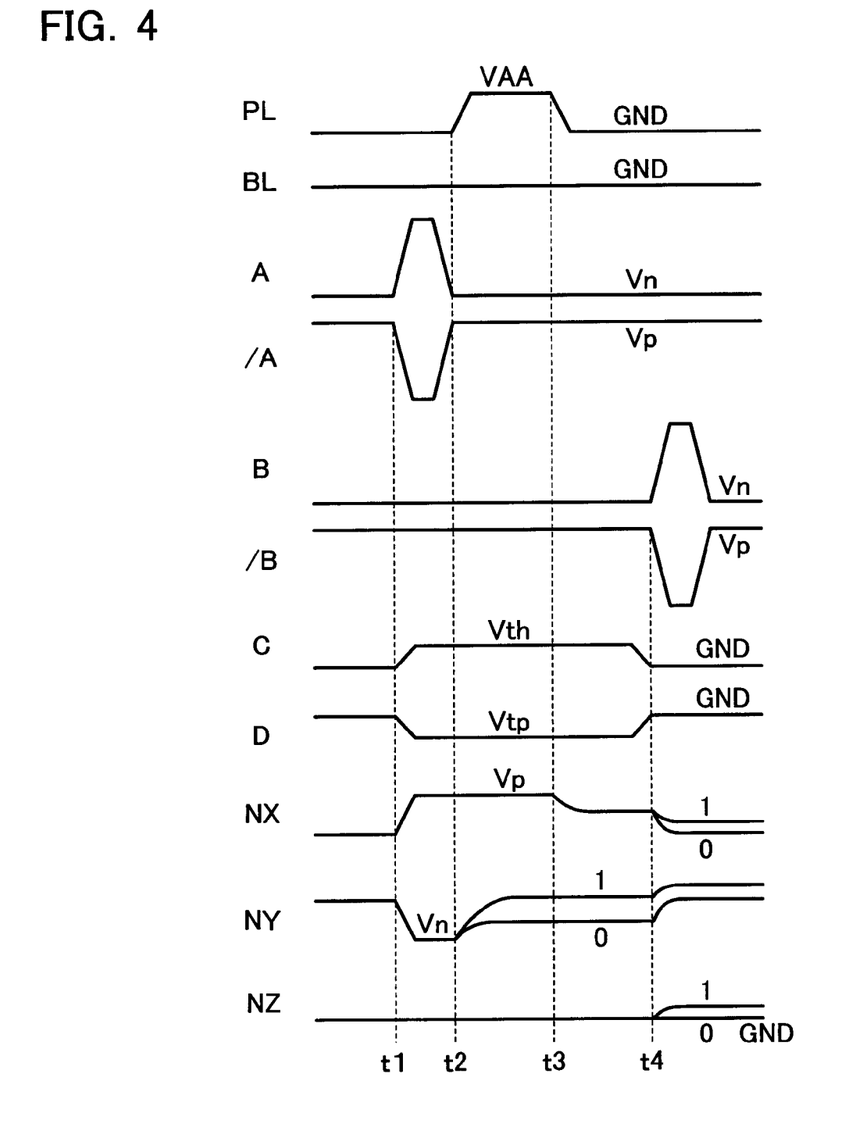
FIG. 4 is a timing chart illustrative of operation of the ferroelectric memory in the first embodiment.

Operation of the ferroelectric memory of the first embodiment is described next with reference to a timing chart of FIG. 4.

First, at time t1, the gate signal A rises to "H" higher than the negative constant potential Vn during a certain period while the gate signal /A falls to "L" lower than the positive constant voltage Vp during the certain period. As a result, the p-type MOS transistor QP14 and the n-type MOS transistor QN14 turn on and charge the nodes NX, NY up to the voltages Vp, Vn, respectively. At the same time, the voltages of the gate signals C and D are set at Vtn, Vtp, which are almost equal to respective threshold voltages.

Subsequently, at time t2, the potential on the plate line PL linked to the read-aimed memory cell M is raised up to a supply voltage VAA. At the same time, the potential on the word line WL linked to that memory cell is made "H". Then, the charge on the ferroelectric capacitor C is transferred to the bit line BL and the potential on the bit line BL starts to rise from the ground potential GND.

When the potential on the bit line BL rises even slightly higher than the ground potential GND, the p-type MOS transistor QP13 given the threshold voltage Vtp (gate signal D) on the gate turns on and transfers the charge on the bit line BL to the node NY. When the potential on the bit line BL thus descends and returns to the ground potential GND, the p-type MOS transistor QP13 turns off again. Namely, the charge q1 flowing from the ferroelectric capacitor C is all transferred to the node NY and accumulated in the capacitor Cn. The potential on the node NY rises by the extent of the charge q1. The degree of the rise varies depending on the data held in the memory cell M and is larger when the held data is "1" than "0" (see the chart of NY in FIG. 4). During this period, the potential on the bit line BL is retained at the ground potential GND and thus the bit line capacitance causes no reduction in the amount of signals.

Next, at time t3, the potential on the plate line PL is reset to the ground potential GND. Then, the potential on the bit line BL starts falling to a potential lower than the ground potential GND.

The n-type MOS transistor QN13 is, however, given the threshold voltage Vtn (gate signal C) on the gate. Accordingly, when the potential on the bit line BL becomes even slightly lower than the ground potential GND, the n-type MOS transistor QN13 turns on and transfers the charge from the node NX, that is, the capacitor Cp to the bit line BL. As a result, when the potential on the bit line BL rises and returns to the ground potential GND, the n-type MOS transistor QN13 turns off again. Namely, the charge q2 flowing in the ferroelectric capacitor C is all supplied from the node NX, that is, the capacitor Cp. The potential on the node NX lowers by the extent of the charge q2. The variation in potential on the node NX at this time does not change in accordance with the data held in the read-aimed memory cell.

Thereafter, at time t4, the voltages of the gate signals C, D are reset to the ground potential GND and the gate signal B is kept at "H" for a certain period. In addition, the gate signal /B is kept at "L" for the certain period. As a result, the p-type MOS transistor QP15 and the n-type MOS transistor QN15 turn on and connect the nodes NX, NY, NZ to each other.

If the data held in the memory cell M is "0", the potential on the node NZ becomes the ground potential GND. This is because the charge q1 flowing out of the ferroelectric capacitor C during time t2-t3 is equal to the charge q2 flowing in the ferroelectric capacitor C during time t3-t4. Therefore, the potential on the node NZ becomes the ground potential GND.

If the data held in the memory cell M is "1", on the other hand, the potential on the node NZ becomes larger than the ground potential GND. This is because the charge q1 flowing out of the ferroelectric capacitor C during time t2-t3 is larger than the charge q2 flowing to the ferroelectric capacitor C during time t3-t4.

Figure 5:
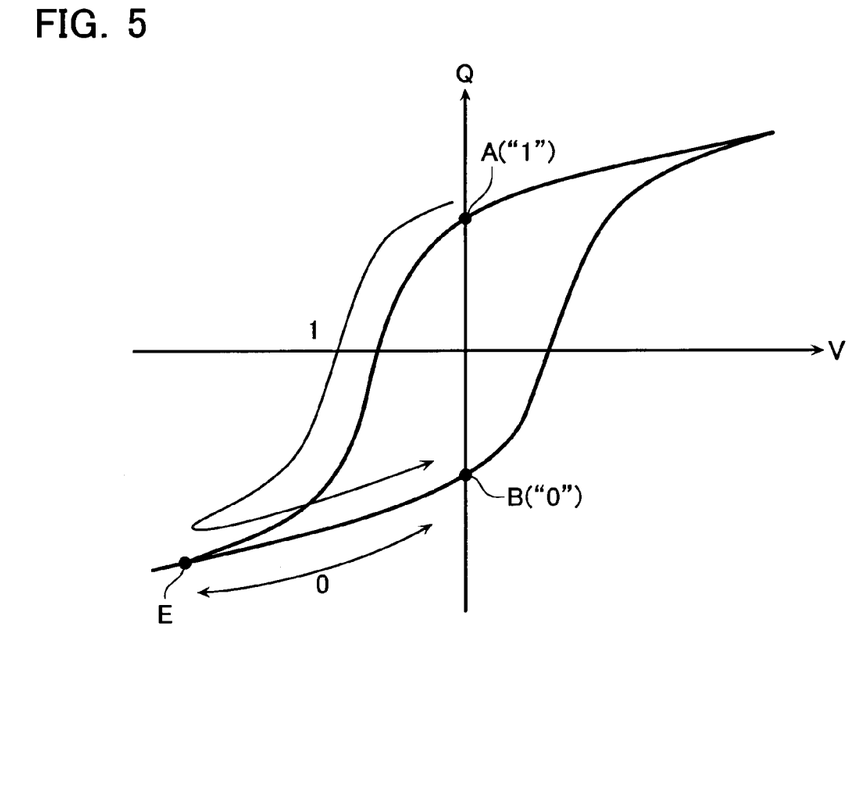
FIG. 5 illustrates operation of the ferroelectric memory in the first embodiment with reference to the hysteresis characteristic of a ferroelectric capacitor C.

This is described with reference to the hysteresis characteristic of the ferroelectric capacitor C shown in FIG. 5.

If the data held in the memory cell M is "0", and no voltage is application to the ferroelectric capacitor C before reading (time t1) keeps the ferroelectric capacitor C in a state of the point B. When a voltage is applied to the plate line PL from this state at time t2 to start reading, the ferroelectric capacitor C makes a transition to a state of the point E. Thereafter, when the potential on the plate line PL is reset to the ground potential GND at time t3, the ferroelectric capacitor C returns to the state of the point B again. Therefore, the charge q1 flowing out of the ferroelectric capacitor C during the transition from the state of the point B to E is equal to the charge q2 flowing into the ferroelectric capacitor C during the transition from the point E to B. After all, no charge can flow out of the ferroelectric capacitor C in total and no variation arises in the potential on the node NZ.

On the other hand, if the data held in the memory cell M is "1", a voltage application to the plate line PL at time t2 to start reading makes a transition from the state of the point A to E.

Thereafter, when the potential on the plate line PL is reset to the ground potential GND at time t3, it is not returned to the state of the point A but transferred to the state of the point B. Namely, this results in destructive read, which exhibits different states before and after reading. Thus, the above-described charge q1 becomes larger than the charge q2 and therefore the potential on the node NZ becomes larger than the ground potential GND.

As described above, in accordance with the present embodiment, the potential on the bit line BL is fixed at the ground potential GND during reading. Accordingly, a sufficient voltage can be applied across the terminals of the ferroelectric capacitor independent of the increase in bit line capacitance, thereby obtaining a larger read signal.

In addition, if the data held in the memory cell M is "0", the potential on the node NZ becomes equal to the ground potential GND independent of the hysteresis characteristic of the ferroelectric capacitor. Accordingly, it is sufficient to set the reference voltage to a slightly larger value than the ground potential GND, which makes setting of the reference voltage easier.

Second Embodiment

A semiconductor memory device according to a second embodiment of the present invention is described next with reference to the drawings. The general configuration of the present embodiment is similar to that in the first embodiment (FIG. 1) and accordingly omitted from the following description. The present embodiment is different in structure of the sense amp circuit 4 from the first embodiment.

Figure 6:
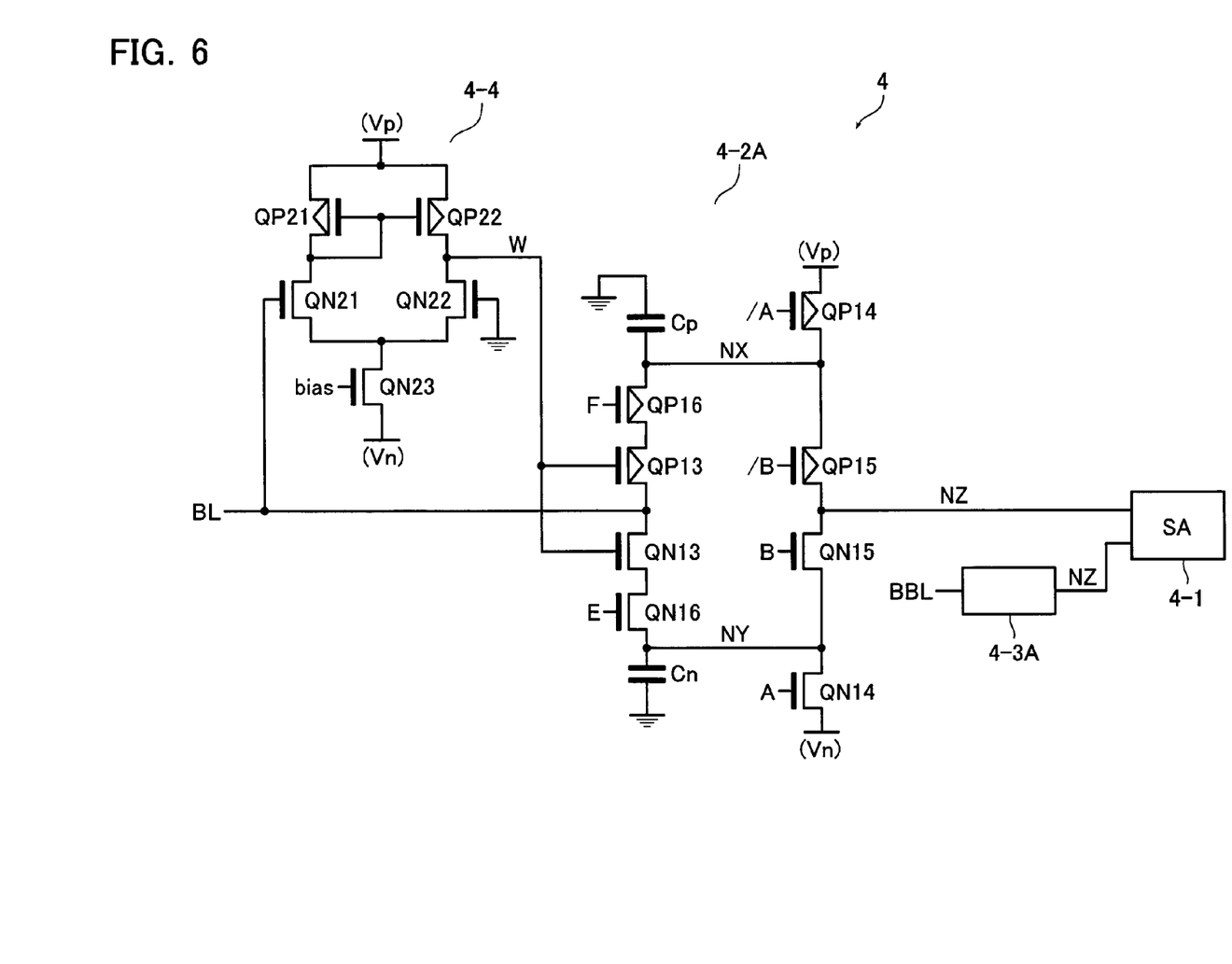
FIG. 6 is a circuit diagram showing a configuration of a sense amp circuit 4 in a semiconductor memory device according to a second embodiment.

FIG. 6 is a circuit diagram showing a configuration of the sense amp circuit 4 in the semiconductor memory device according to the second embodiment. The sense amp circuit 4 of the present embodiment includes a bit line control circuit 4-2A between the bit line BL and the differential amplifier 4-1 as shown in FIG. 6. It also includes a bit line control circuit 4-3A between the bit line BBL and the differential amplifier 4-1. The bit line control circuits 4-2A and 4-3A have the same configuration and accordingly FIG. 6 shows only the configuration of the former. The same components as those in the bit line control circuit 4-2 of the first embodiment (FIG. 3) are denoted with the same reference numerals also in FIG. 6 and omitted from the following detailed description.

A difference from the bit line control circuit 4-2 of the first embodiment (FIG. 3) is that the transistors QN13 and QP13 are connected in reverse order (the transistor QP13 is connected close to the node NX). Another difference is that a p-type MOS transistor QP16 and an n-type MOS transistor QN16 are connected between the transistor QP13 and the node NX and between the transistor QN13 and the node NY, respectively. The connection node between the transistors QN13, QP13 is connected to the bit line BL. The transistors QP16 and QN16 are provided to control connection and disconnection between the bit line BL and the node NX, NY. A gate signal F given to the gate of the transistor QP16 and a gate signal E given to the gate of the transistor QN16 are designed as signals having sufficiently larger voltage values than the respective threshold voltages.

The present embodiment is also provided with a differential amplifier 4-4 operative to amplify the difference between the potential on the bit line BL and the ground potential GND, different from the first embodiment also in this point. The differential amplifier 4-4 includes p-type MOS transistors QP21, QP22 and n-type MOS transistors QN21, QN22, QN23. The transistors QP21, QN21 and QN23 are serially connected between the positive voltage Vp and the negative voltage Vn. The transistor QP21 is also diode-connected. The transistors QP22, QN22 and QN23 are serially connected between the positive voltage Vp and the negative voltage Vn. The transistors QP21, QP22 have respective gates, which are connected to each other. The transistors QN21, QN22 have respective gates, which are connected to the bit line BL and the ground potential GND, respectively. The connection node between the transistors QP22 and QN22 is used as the output node for an output signal W. The output signal W is fed to the gates of the transistors QP13, QN13. The transistor QN23 has a gate, which is given a bias signal, bias, slightly higher than the threshold voltage of the transistor QN23. As a result, the transistor QN23 serves as a constant current source.

Figure 7:
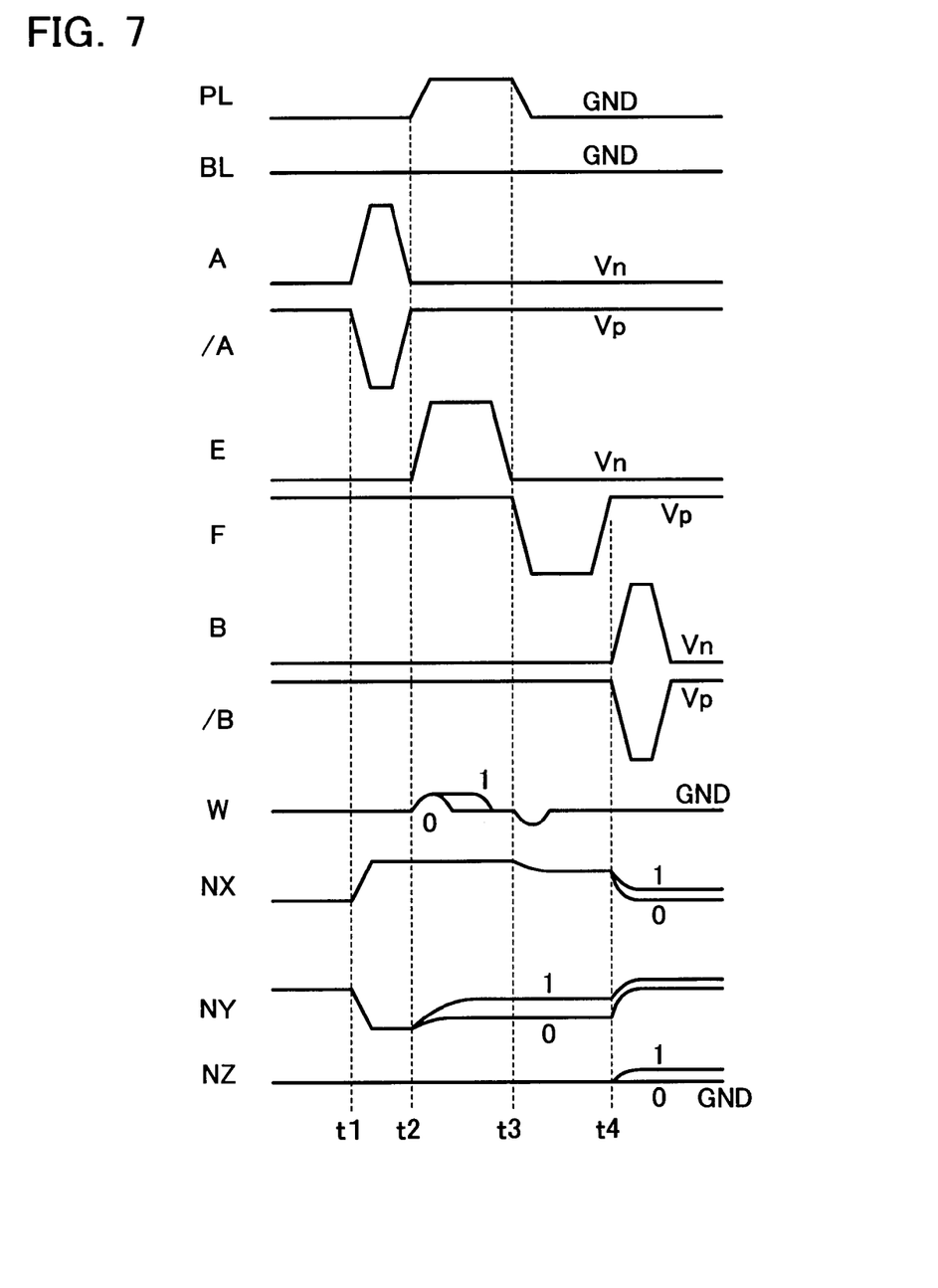
FIG. 7 is a timing chart illustrative of operation of a ferroelectric memory in the second embodiment.

Operation of the present embodiment is described next with reference to a timing chart of FIG. 7.

First, at time t1, the gate signal A rises to "H" higher than the negative constant voltage Vn during a certain period while the gate signal /A falls to "L" lower than the positive constant voltage Vp during the certain period. As a result, the p-type MOS transistor QP14 and the n-type MOS transistor QN14 turn on and charge the nodes NX, NY up to the voltages Vp, Vn, respectively.

Subsequently, at time t2, the gate signal E is made "H" to turn on the transistor QN1 and the potential on the plate line PL linked to the read-aimed memory cell M is raised up to the supply voltage VAA. At the same time, the potential on the word line WL linked to that memory cell is made "H". Then, the charge on the ferroelectric capacitor C is transferred to the bit line BL and the potential on the bit line BL starts to rise from the ground potential GND.

When the potential on the bit line BL rises even slightly higher than the ground potential GND, it is compared/amplified in the differential amplifier 4-4, which provides the voltage of the output voltage W of "H". As a result, the transistor QN13 turns on and transfers the charge on the bit line BL to the node NY. When the potential on the bit line BL thus returns to the ground potential GND, the output voltage W also becomes the ground potential GND and thus the MOS transistor QN13 turns off again. Namely, the charge q1 flowing from the ferroelectric capacitor C is all transferred to the node NY and accumulated in the capacitor Cn.

Next, at time t3, the potential on the plate line PL is reset to the ground potential GND and the gate signal E is reset to the negative constant voltage Vn while the gate signal F is made "L" lower than the positive constant voltage Vp to turn on the transistor QP16. Then, the potential on the bit line BL starts falling to a potential lower than the ground potential GND. It is amplified in the differential amplifier 4-4, which provides the output voltage W of a voltage lower than the ground potential GND. As a result, the transistor QP13 turns on and transfers the charge from the node NX, that is, the capacitor Cp to the bit line BL. When the potential on the bit line BL rises and returns to the ground potential GND again, the transistor QP13 turns off again. Namely, the charge q2 flowing into the ferroelectric capacitor C is all supplied from the node NX, that is, the capacitor Cp.

Thereafter, at time t4, the voltage of the gate signal F is reset to the positive constant voltage Vp and the gate signal B is made "H" higher than the negative constant voltage Vn for a certain period. In addition, the gate signal /B is made "L" lower than the positive constant voltage Vp for the certain period. As a result, the p-type MOS transistor QP15 and the n-type MOS transistor QN15 turn on and connect the nodes NX, NY, NZ to each other.

For the same reason as the first embodiment, if the data held in the memory cell M is "0", the potential on the node NZ becomes the ground potential GND. If the data held in the memory cell M is "1", on the other hand, the potential on the node NZ becomes larger than the ground potential GND. Therefore, like the first embodiment, setting of the reference voltage can be made easier also in the present embodiment. In addition, the potential on the bit line BL is fixed at the ground potential GND and accordingly a larger read signal can be obtained. Additionally, the potential on the bit line BL in the present embodiment is amplified in the differential amplifier 4-4 and the output voltage W therefrom is used to on/off control charge-transfer transistors QP16, QN16. Therefore, it can be expected to achieve faster operation than the first embodiment.

Third Embodiment

A semiconductor memory device according to a third embodiment of the present invention is described next with reference to the drawings. The general configuration of the present embodiment is similar to that in the first embodiment (FIG. 1) and accordingly omitted from the following description. The present embodiment is different in structure of the sense amp circuit 4 from the first embodiment.

Figure 8:
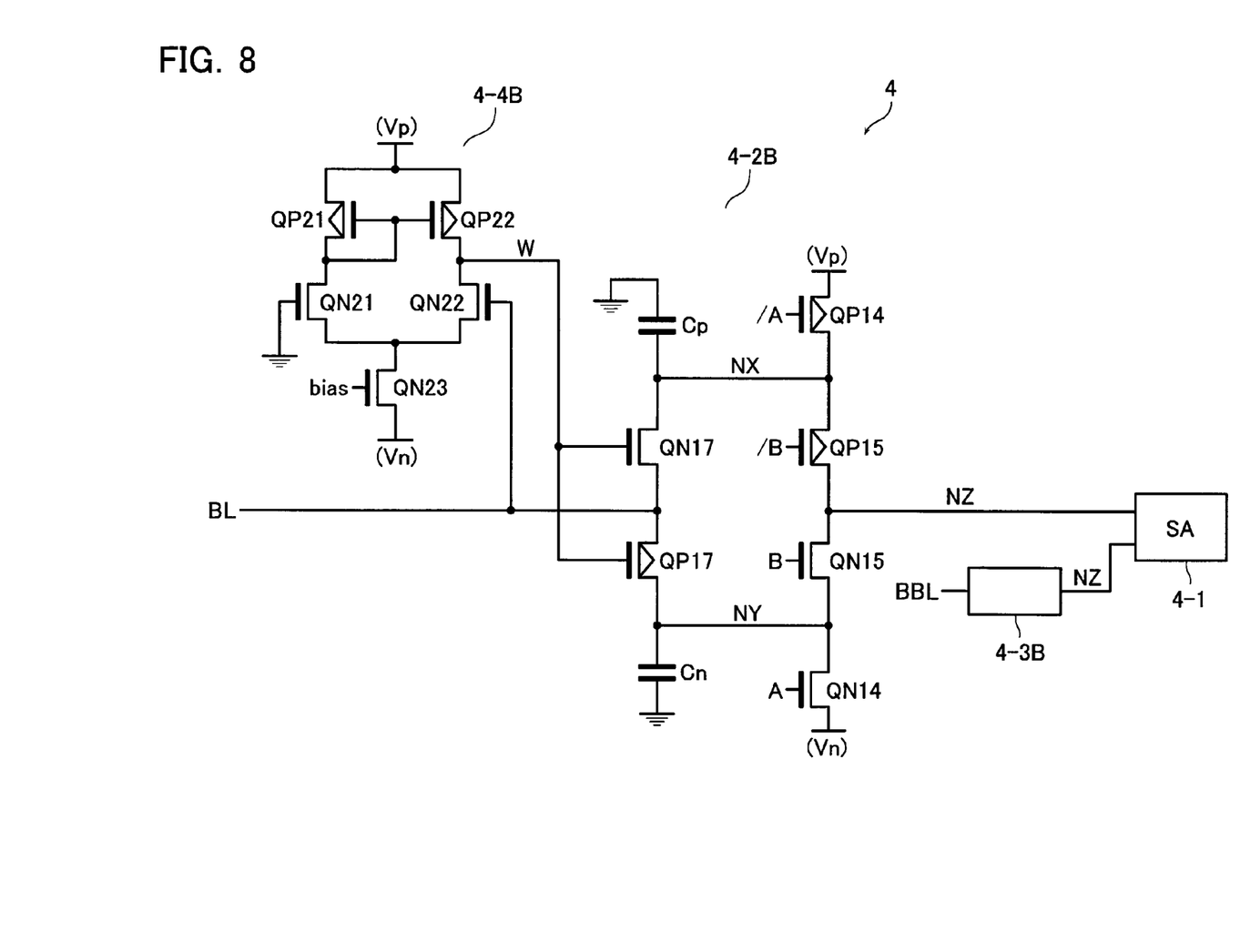
FIG. 8 is a circuit diagram showing a configuration of a sense amp circuit 4 in a semiconductor memory device according to a third embodiment.

FIG. 8 is a circuit diagram showing a configuration of the sense amp circuit 4 in the semiconductor memory device according to the third embodiment. The sense amp circuit 4 of the present embodiment includes a bit line control circuit 4-2B between the bit line BL and the differential amplifier 4-1 as shown in FIG. 8. It also includes a bit line control circuit 4-3B between the bit line BBL and the differential amplifier 4-1.

Figure 9:
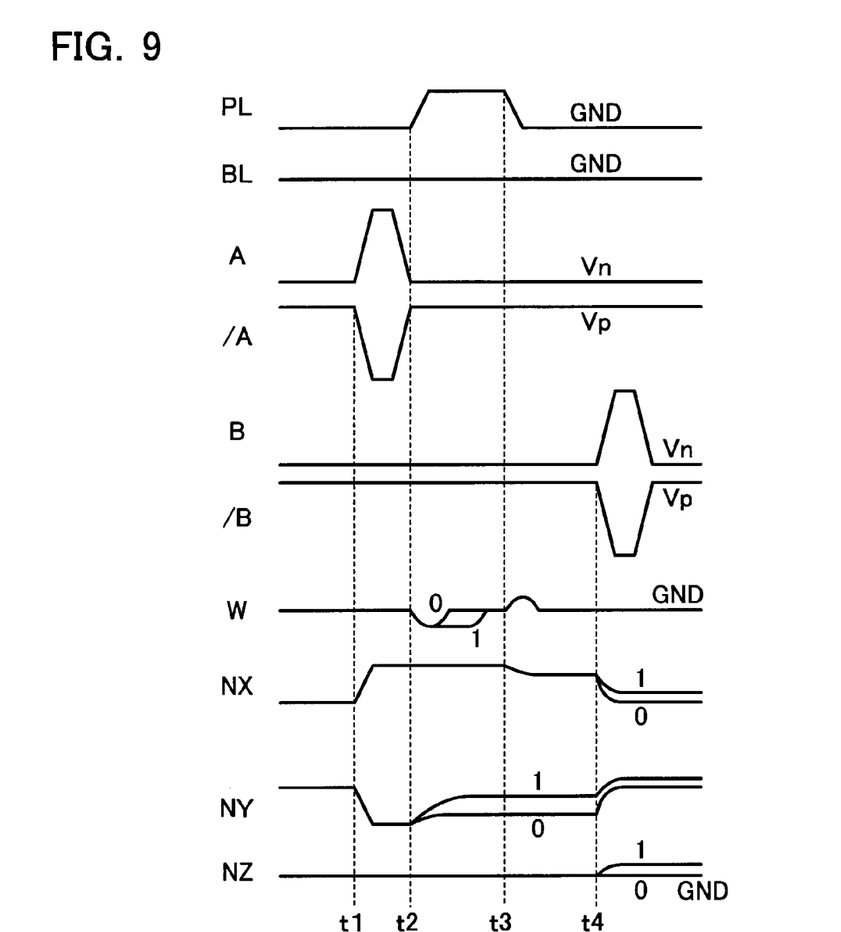
FIG. 9 is a timing chart illustrative of operation of a ferroelectric memory in the third embodiment.

The bit line control circuits 4-2B and 4-3B have the same configuration and accordingly FIG. 9 shows only the configuration of the former. The same components as those in the bit line control circuit 4-2 of the first embodiment (FIG. 3) are denoted with the same reference numerals also in FIG. 6 and omitted from the following detailed description.

In the present embodiment, charge-transfer transistors QN17 and QP17 serially connected between the nodes NX and NY are connected in this order seen from the node NX. This point is in common with the first embodiment (the transistors QN13, QP13) except that the transistors QN17, QP17 have respective gates given the output voltage W from a differential amplifier 4-4B, different from the first embodiment.

The differential amplifier 4-4B has an output node for the output voltage W, which is the connection node between the n-type MOS transistor QN22 having the gate given the potential on the bit line and the p-type MOS transistor QP22 serially connected thereto, different from the second embodiment. (The differential amplifier 4-4 in FIG. 6 has the output node for the output voltage W, which is the connection node between the n-type MOS transistor QN22 having the gate given the ground potential GND and the p-type MOS transistor QP22 serially connected thereto).

Operation of the present embodiment is described next with reference to a timing chart of FIG. 9.

First, at time t1, the gate signal A rises to "H" higher than the negative constant voltage Vn during a certain period while the gate signal /A falls to "L" lower than the positive constant voltage Vp during the certain period. As a result, the p-type MOS transistor QP14 and the n-type MOS transistor QN14 turn on and charge the nodes NX, NY up to the voltages Vp, Vn, respectively.

Subsequently, at time t2, the potential on the plate line PL linked to the read-aimed memory cell M is raised up to the supply voltage VAA. At the same time, the potential on the word line WL linked to that memory cell is made "H". Then, the charge on the ferroelectric capacitor C is transferred to the bit line BL and the potential on the bit line BL starts to rise from the ground potential GND.

When the potential on the bit line BL rises even slightly higher than the ground potential GND, it is compared/amplified in the differential amplifier 4-4, which provides the voltage of the output voltage W of "L" lower than the ground potential GND. As a result, the p-type MOS transistor QP17 turns on and transfers the charge on the bit line BL to the node NY. When the potential on the bit line BL thus returns to the ground potential GND, the output voltage W also becomes the ground potential GND and thus the p-type MOS transistor QP17 turns off again. Namely, the charge q1 flowing from the ferroelectric capacitor C is all transferred to the node NY and accumulated in the capacitor Cn.

Next, at time t3, the potential on the plate line PL is reset to the ground potential GND. Then, the potential on the bit line BL starts falling to a potential lower than the ground potential GND. It is amplified in the differential amplifier 4-4B, which provides the output voltage W of a voltage higher than the ground potential GND. As a result, the n-type MOS transistor QP17 turns on and transfers the charge from the node NX, that is, the capacitor Cp to the bit line BL. When the potential on the bit line BL rises and returns to the ground potential GND, the n-type MOS transistor QP17 turns off again. Namely, the charge q2 flowing in the ferroelectric capacitor C is all supplied from the node NX, that is, the capacitor Cp.

Thereafter, at time t4, the gate signal B is made "H" larger than the negative constant voltage Vn for a certain period. In addition, the gate signal /B is made "L" smaller than the positive constant voltage Vp for the certain period. As a result, the p-type MOS transistor QP15 and the n-type MOS transistor QN15 turn on and connect the nodes NX, NY, NZ to each other.

Like the above embodiments, if the data held in the memory cell M is "0", the potential on the node NZ becomes the ground potential GND. If the data held in the memory cell M is "1", on the other hand, the potential on the node NZ becomes larger than the ground potential GND. Therefore, like the first embodiment, setting of the reference voltage can be made easier also in the present embodiment. In addition, the potential on the bit line BL is fixed at the ground potential GND and accordingly a larger read signal can be obtained. Additionally, the potential on the bit line BL in the present embodiment is amplified in the differential amplifier 4-4B. Accordingly, it can be expected to achieve faster operation, like the second embodiment.

Figure 10:
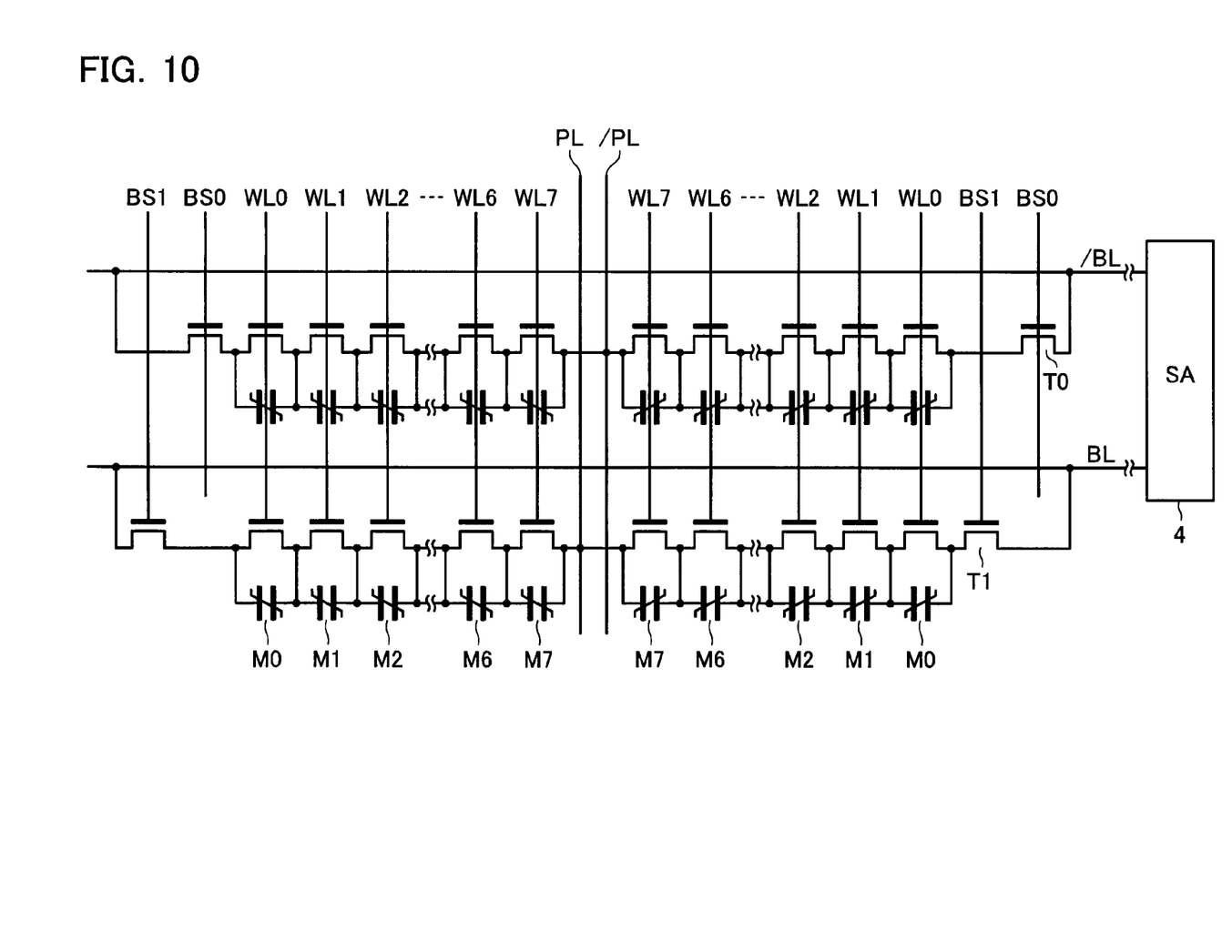
FIG. 10 shows a ferroelectric memory of the TC parallel unit serial connection type to which the embodiment is applied.

The embodiments of the present invention have been described above though the present invention is not limited to these embodiments but rather can be given various modifications, additions and so forth without departing from the scope and spirit of the invention. For example, the above embodiments show the examples of the ferroelectric memory having a DRAM-like structure, to which the present invention is applied. The present invention is similarly applicable to a ferroelectric memory of the TC parallel unit serial connection type, which includes plural (eight in the shown example) 1-transistor/1-capacitor memory cells M serially chain-connected as shown in FIG. 10. In the ferroelectric memory of the TC parallel unit serial connection type, all word lines WL are made "H" to make a short circuit across both ends of the ferroelectric memory in the standby state. In this state, a selected word line is made "L" to execute read/write.

The transistors QP16, QN16 used in the second embodiment to control the connection and disconnection between the bit line BL and the node NX, NY can also used in the first and second embodiments. In a word, various forms may be used if they include a first transistor connected between the node NX and the bit line BL and operative to turn on when the potential on the bit line BL becomes higher than the ground potential GND, and a second transistor connected between the node NY and the bit line BL and operative to turn on when the potential on the bit line BL becomes larger than the ground potential GND.

What is claimed is:

1. A semiconductor memory device, comprising:
   a memory cell array with memory cells each including a ferroelectric capacitor and a selection transistor serially connected;
   a plate line connected to one end of the ferroelectric capacitor and supplied with a certain plate line voltage;
   a bit line connected to one end of the selection transistor; and
   a sense amp circuit operative to sense/amplify the voltage on the bit line, the sense amp circuit including:
      a first node given a first constant voltage having a positive value larger than a fixed potential before reading;
      a second node given a second constant voltage having a negative value smaller than the fixed potential before reading;
      a third node to be connected to the first and second nodes on reading;
      a first transistor connected between the first node and the bit line and operative to turn on when the potential on the bit line becomes smaller than the fixed potential;
      a second transistor connected between the second node and the bit line and operative to turn on when the potential on the bit line becomes larger than the fixed potential;
      a first capacitor connected between the first node and the fixed potential;
      a second capacitor connected between the second node and the fixed potential; and
      a differential amplifier circuit operative to amplify the potential on the third node in comparison with a reference potential.

2. The semiconductor memory device according to claim 1, wherein the first transistor is an n-type MOS transistor having a gate supplied with a threshold voltage during reading and operative to turn on when the voltage on the bit line becomes smaller than the fixed potential,
   wherein the second transistor is a p-type MOS transistor having a gate supplied with a threshold voltage during reading and operative to turn on when the voltage on the bit line becomes larger than the fixed potential.

3. The semiconductor memory device according to claim 1, further comprising
   a third transistor connected between the first node and the third node, and
   a fourth transistor connected between the second node and the third node,
   the third and fourth transistors being configured to turn on simultaneously.

4. The semiconductor memory device according to claim 1, wherein the first and second constant voltages has the same absolute value.

5. The semiconductor memory device according to claim 1, wherein the first and second capacitors has the same capacitance.

6. The semiconductor memory device according to claim 1, further comprising
   a third transistor having one end given the first constant voltage thereto and the other end connected to the first node, the third transistor being configured to turn on for a certain period before reading, and
   a fourth transistor having one end given the second constant voltage thereto and the other end connected to the second node, the fourth transistor being configured to turn on for a certain period before reading.

7. The semiconductor memory device according to claim 1, further comprising a differential amplifier operative to amplify the difference between the potential on the bit line and the fixed potential to provide an output signal,
   wherein the first and second transistors are configured to turn on in accordance with the output signal from the differential amplifier.

8. The semiconductor memory device according to claim 7, wherein the differential amplifier is configured to provide an output signal of a positive voltage larger than the fixed potential when the potential on the bit line becomes larger than the fixed potential and on the other hand provide an output signal of a negative voltage smaller than the fixed potential when the potential on the bit line becomes smaller than the fixed potential,
   wherein the first transistor is a p-type MOS transistor operative to turn on when the output signal has a negative voltage smaller than the fixed potential,
   wherein the second transistor is an n-type MOS transistor operative to turn on when the output signal has a positive voltage larger than the fixed potential.

9. The semiconductor memory device according to claim 1, further comprising
   a third transistor serially connected to the first transistor between the first node and the bit line, and
   a fourth transistor serially connected to the second transistor connected between the second node and the bit line.

10. The semiconductor memory device according to claim 7, further comprising
    a third transistor connected between the first node and the third node, and
    a fourth transistor connected between the second node and the third node,
    the third and fourth transistors being configured to turn on simultaneously.

11. The semiconductor memory device according to claim 7, wherein the first and second constant voltages has the same absolute value.

12. The semiconductor memory device according to claim 7, wherein the first and second capacitors has the same capacitance.

13. The semiconductor memory device according to claim 7, further comprising
    a third transistor having one end given the first constant voltage thereto and the other end connected to the first node, the third transistor being configured to turn on for a certain period before reading, and
    a fourth transistor having one end given the second constant voltage thereto and the other end connected to the second node, the fourth transistor being configured to turn on for a certain period before reading.

14. The semiconductor memory device according to claim 7, wherein the differential amplifier is configured to provide an output signal of a negative voltage smaller than the fixed potential when the potential on the bit line becomes larger than the fixed potential and on the other hand provide an output signal of a positive voltage larger than the fixed potential when the potential on the bit line becomes smaller than the fixed potential, wherein the first transistor is an n-type MOS transistor operative to turn on when the output signal has a positive voltage larger than the fixed potential, wherein the second transistor is a p-type MOS transistor operative to turn on when the output signal has a negative voltage smaller than the fixed potential.

* * * * *